(12) United States Patent
Reznicek et al.

(10) Patent No.: US 11,114,146 B2
(45) Date of Patent: Sep. 7, 2021

(54) NANOSECOND NON-DESTRUCTIVELY ERASABLE MAGNETORESISTIVE RANDOM-ACCESS MEMORY

(71) Applicant: International Business Machines Corporation, Armonk, NY (US)

(72) Inventors: Alexander Reznicek, Troy, NY (US); Eric Raymond Evarts, Niskayuna, NY (US); Virat Vasav Mehta, Menands, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/693,469

(22) Filed: Nov. 25, 2019

(65) Prior Publication Data

US 2021/0158850 A1    May 27, 2021

(51) Int. Cl.
| | | |
|---|---|---|
| *G11C 11/00* | (2006.01) | |
| *G11C 11/16* | (2006.01) | |
| *H01L 27/22* | (2006.01) | |
| *H01S 5/183* | (2006.01) | |
| *H01S 5/343* | (2006.01) | |

(Continued)

(52) U.S. Cl.
CPC ........ *G11C 11/1695* (2013.01); *G11C 11/161* (2013.01); *G11C 11/1675* (2013.01); *H01F 41/34* (2013.01); *H01L 23/576* (2013.01); *H01L 27/222* (2013.01); *H01L 43/02* (2013.01); *H01L 43/12* (2013.01); *H01S 5/0261* (2013.01); *H01S 5/183* (2013.01); *H01S 5/34313* (2013.01); *H01F 10/3254* (2013.01); *H01F 10/3286* (2013.01); *H01L 43/10* (2013.01)

(58) Field of Classification Search
CPC .............. G11C 11/1695; G11C 11/161; G11C 11/1675; H01L 23/576; H01L 27/222; H01L 43/02; H01L 43/12
See application file for complete search history.

(56) References Cited

U.S. PATENT DOCUMENTS 7,079,148 B2 * 7/2006 Sharma ............... G06F 15/8007
345/519
7,551,657 B2 * 6/2009 Nurmikko .............. B82Y 25/00
372/37

(Continued)

FOREIGN PATENT DOCUMENTS

CN    108766937 A    11/2018

OTHER PUBLICATIONS

"Vertical-cavity surface-emitting laser", Wikipedia, 8 pages, This page was last edited on Sep. 4, 2019, at 07:29 (UTC), <Vertical-cavity surface-emitting laser—Wikipedia>.

(Continued)

*Primary Examiner* — Pho M Luu
(74) *Attorney, Agent, or Firm* — David Mattheis; Maeve M. Carpenter

(57) ABSTRACT

An erasable magnetoresistive random-access memory (MRAM) structure and a method of making the same includes an MRAM cell disposed between bit line and word line circuit elements, and a vertical-cavity surface-emitting laser (VCSEL) element disposed above the MRAM cell. A laser output of the VCSEL is directed toward the MRAM cell.

18 Claims, 6 Drawing Sheets

(51) Int. Cl.
*H01L 43/02* (2006.01)
*H01F 41/34* (2006.01)
*H01S 5/026* (2006.01)
*H01L 23/00* (2006.01)
*H01L 43/12* (2006.01)
*H01F 10/32* (2006.01)
*H01L 43/10* (2006.01)

(56) References Cited

U.S. PATENT DOCUMENTS

| | | | |
|---|---|---|---|
| 7,830,704 | B1 | 11/2010 | Mani |
| 8,482,971 | B2 | 7/2013 | Wang |
| 9,588,908 | B2 | 3/2017 | Cambou |
| 2005/0260773 | A1 | 11/2005 | Hong |
| 2007/0058422 | A1* | 3/2007 | Phillips ............ G11B 5/4907 365/158 |
| 2009/0251960 | A1 | 10/2009 | Schultz |
| 2010/0109061 | A1 | 5/2010 | Kushida |
| 2017/0271576 | A1 | 9/2017 | O'Brien |
| 2019/0018986 | A1 | 1/2019 | Choi |

OTHER PUBLICATIONS

Chen et al., "High Performance Single-Grain Ge TFTs without Seed Substrate", 4 pages, IEDM10-496, © 2010 IEEE.

Chen et al., "Integrated High Performance (100) and (110) Oriented Single-Grain Si TFTs without Seed Substrate", 4 pages, IEDM09-179, © 2009 IEEE.

D'Asaro et al., "The VCSEL Advantage: Increased Power, Efficiency Bring New Applications", Photonics Media, photonics.com, retrieved from the Internet on Oct. 15, 2019, 6 pages, <https://www.photonics.com/Article.aspx? AID=25102>.

Ishihara et al, "Monolithic 3D-ICs with Single Grain Si Thin Film Transistors", 4 pages, © 2012 IEEE.

"Nanosecond Non-Destructively Erasable Magnetoresistive Random-Access Memory", PCT Application No. PCTIB2020/059997, Filed on Oct. 23, 2020, 18 pages.

Patent Cooperation Treaty, Notification of Transmittal of the International Search Report and the Written Opinion of the International Searching Authority, or the Declaration, dated Feb. 18, 2021, International application No. PCT/I82020/059997, Applicant's or agent's file reference P201807329, 9 pages.

* cited by examiner ular-access memory (MRAM).
NANOSECOND NON-DESTRUCTIVELY ERASABLE MAGNETORESISTIVE RANDOM-ACCESS MEMORY

BACKGROUND

The disclosure relates generally to non-destructively erasable magnetoresistive random-access memory (MRAM). The disclosure relates particularly to nanosecond non-destructively erasable MRAM structures including a vertical cavity surface emitting laser element.

Computing hardware and software systems may be subjected to a variety of external attacks. Attacks may be made using software and also directly upon the system hardware. Hardware security uses physical devices installed on the hardware of a computer system to shield the system from attacks. Hardware security can be more robust than software security and can also add an additional layer of security for important systems. Hardware security measures are often destructive in nature, the attack is prevented but the hardware is destroyed. Thus, the system is protected but some or all of it can be rendered unusable.

MRAM is a type of solid state, non-volatile memory that uses tunneling magnetoresistance (TMR) to store information. MRAM is made up of an electrically connected array of magnetoresistive memory elements, referred to as magnetic tunnel junctions (MTJs). Each MTJ includes a free layer and fixed layer that each include a layer of a magnetic material, and that are separated by a non-magnetic insulating tunnel barrier. The free layer has a variable magnetization direction, and the fixed layer has an invariable magnetization direction. An MTJ stores information by switching the magnetization state of the free layer. When the magnetization direction of the free layer is parallel to the magnetization direction of the fixed layer, the MTJ is in a low resistance state. Conversely, when the magnetization direction of the free layer is antiparallel to the magnetization direction of the fixed layer, the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM. MRAM cells can be subject to thermal activation—raising the temperature of the cells beyond an activation threshold changes the state of the data storage even in the absence of an activating magnetic field.

A vertical-cavity surface-emitting laser (VCSEL) is a type of semiconductor laser diode which emits energy from a surface of the diode. The VCSEL includes two opposing mirrors parallel to the wafer surface with one or more quantum wells disposed between the mirrors.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatuses and/or computer program products enable streamlining compliance reporting and remediation/override through the clustering of system servers according to compliance protocol deviations.

In one aspect the invention includes a non-destructively erasable magnetoresistive random-access memory (MRAM) structure including an MRAM cell disposed between bit line and word line circuit elements, and a vertical-cavity surface-emitting laser (VCSEL) element disposed above the MRAM cell; a laser output of the VCSEL is directed toward the MRAM cell.

In one aspect the invention includes a method of fabricating a semiconductor device including fabricating a plurality of magnetoresistive random-access memory (MRAM) cells electrically connected to one or more bit lines and word lines, the plurality of MRAM cells encapsulated in a dielectric material, forming a grain filter cavity in the dielectric material, forming an oriented seed crystal in the grain filter, forming an amorphous semiconductor layer adjacent to the seed crystal, crystallizing the amorphous semiconductor layer, forming a vertical-cavity surface emitting laser (VCSEL) adjacent to the semiconductor layer, removing the semiconductor layer, and forming a dielectric layer on and around the VCSEL.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
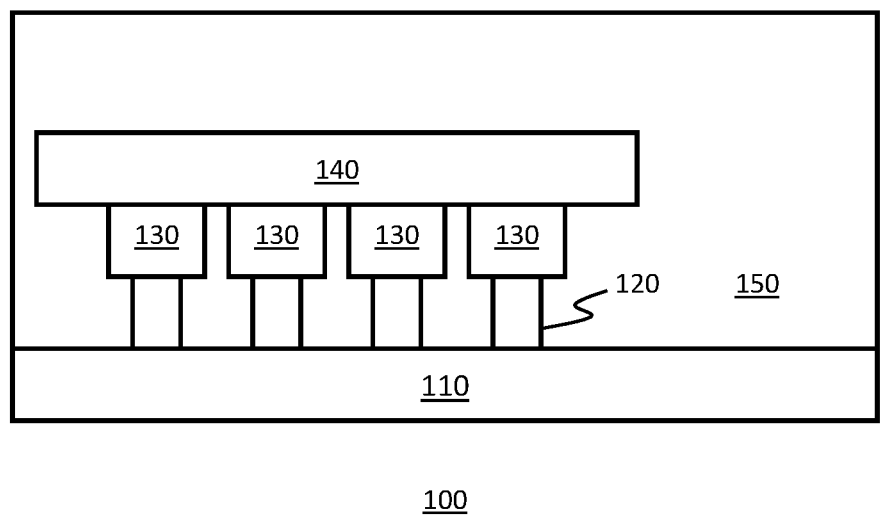
FIG. 1 provides a cross-sectional view of a step in the fabrication of a semiconductor device, according to an embodiment of the invention. The figure illustrates a formed array of MRAM cells electrically connected to bit lines and word lines and surrounded by a dielectric layer.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIG. 1t will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In an embodiment, a semiconductor device includes a magnetoresistive random-access memory (MRAM) array and a vertical-cavity surface-emitting laser (VCSEL) disposed above the MRAM array. In this embodiment, the device activates the VCSEL when a hardware attack is detected. In an embodiment, the hardware attack may be recognized by system elements external to the MRAM device, including hardware and software elements. In an embodiment, device read circuitry is configured to identify hardware attacks according to user specified criteria and to initiate the non-destructive VCSEL memory erasure accordingly.

Activation of the VCSEL provides local heating of the MRAM cells, randomly altering cell states and effectively erasing the data held in the array. No data will remain in the MRAM for a vulnerability exploiting attack to read. The erasure is non-destructive as the functionality of the MRAM is not diminished even though the contents of the MRAM cells have been erased. The system may write new data to the MRAM after the VCSEL heating of the MRAM and accompanying data erasure has occurred. In an embodiment, all the MRAM cells can be heated. Altering at least half the bits is sufficient to prevent reconstruction of the erased data.

In an embodiment, the device includes a write circuit and writes a "1" to all bits using a capacitor placed in line with the word and/or bit lines of the MRAM array. In this embodiment, the system writes the bits while the device is still hot, and the energy barrier to writing in each MRAM cell is lowered.

In an embodiment, the device includes a destructive erasure component. In this embodiment, a large capacitor is connected to the MRAM array and configured to overcharge the magnetic tunnel junctions of the MRAM cells, effectively erasing the MRAM contents and destroying the device, in the event that the VCSEL ceases to function.

What follows is a simplified description of the formation of an array of MRAM memory cell elements. Referring now to FIG. 1, the figure shows a device 100, according to an embodiment of the invention, after the fabrication of the MRAM array has been completed. As shown in the figure, bit lines 120 are disposed upon a semiconductor substrate 110. In an embodiment, bit lines 120 are formed by depositing a conductive material (not shown) upon semiconductor substrate 110. In this embodiment, the conductive material includes an elemental conductor such as copper silver or gold. The bit lines 120 are then formed by selectively removing portions of the conductive material layer by, for example, a photolithographic patterning and etching process that removes exposed portions of the conductive material layers and forms the bit lines 120. This etching can be performed using a timed anisotropic etch such as reactive ion etching (RIE). The etch can be performed in a single etch that removes the conductive material layer forming the bit lines 120.

After the patterning and removal of portions of the conductive material layer forming the bit lines 120, the gaps between the remaining bit lines 120 are filled with a dielectric material 150 such as aluminum-oxide, silicon-oxide or similar dielectric materials. In an embodiment, chemical-mechanical planarization process may be used to ensure that the upper surface of the dielectric material 150 and the conductive material forming the bit lines 120 is flat in preparation for the next step in the device fabrication.

As shown in the figure, a succession of layers is deposited upon the dielectric material 150 and the bit lines 120 to form the magnetic-tunnel junction (MTJ) stacks of the MRAM cells. In an embodiment, the MTJ stacks includes a simplistically depicted MTJ 130 made of a lower contact, a free magnetic layer (a layer having a switchable magnetic dipole moment), a tunnel barrier layer, and a fixed magnetic layer (a layer having a fixed magnetic dipole moment). In this embodiment, the MTJ 130 includes a seed layer (not shown) having free layer grown thereon. The seed layer may include, for example, tantalum (Ta) or tantalum magnesium (TaMg) in some embodiments. The free layer may include cobalt-iron-boron (CoFeB), for example. Next, a tunnel barrier (not shown) is formed on the free layer. The tunnel barrier may include a non-magnetic insulating material such as magnesium oxide (MgO). Following the formation of the tunnel barrier, a fixed layer (not shown) is formed on top of the tunnel barrier. The fixed layer may include, for example one or more interfacial layers, or spacers, and cobalt-platinum (CoIPt) or cobalt-palladium (CoIPd), in multilayers or a mixture, in various embodiments. The respective layers may be formed by radio-frequency sputtering. The free layer and the fixed layer have perpendicular magnetic anisotropy.

In an embodiment, the final MRAM MTJ stack cells are formed using a patterning and etching process as described above. A dielectric material is deposited around the MRAM MTJ stacks and a CMP process is used to provide a flat surface for the next step, the formation of the word lines 140. In an embodiment, the word lines 140 are formed by depositing a layer of conductive material, selectively etching that material and depositing a dielectric material similar to the dielectric material 150 upon the etched structure.

Figure 2:
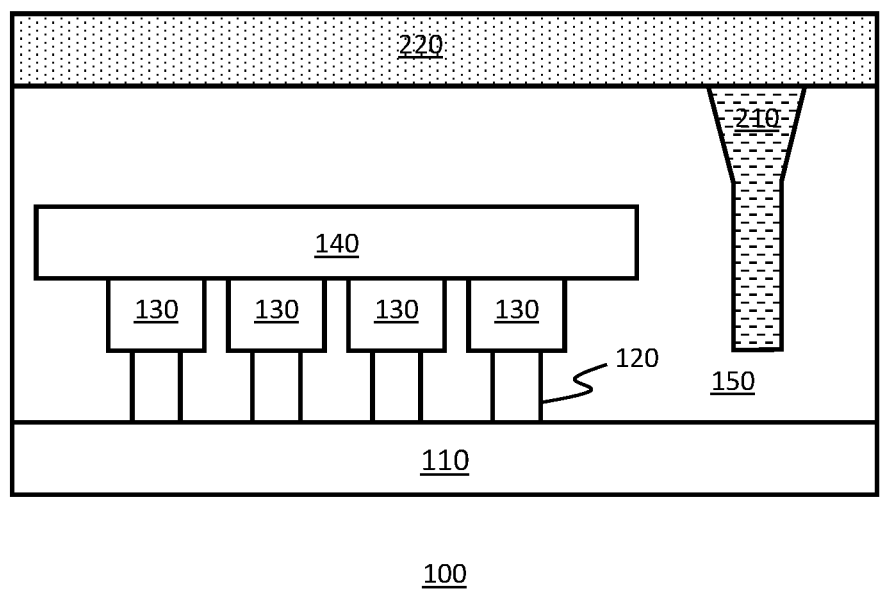
FIG. 2 provides a cross-sectional view of a step in the fabrication of a semiconductor device, according to an embodiment of the invention. The figure illustrates an etched crystal seed cavity filled with (100) oriented Ge and the deposition of a layer of amorphous Ge.

Referring now to FIG. 2, a grain filter seed cavity 210 (hereinafter referred to as "seed cavity"), is formed in the dielectric material 150. In an embodiment, seed cavity 210 is formed using patterning and etching techniques as described above. In this embodiment, the seed cavity 210 is between about 300 nm to about 500 nm deep and between about 100 nm to about 200 nm wide. In an embodiment, Ge is deposited in the seed cavity 210 and a crystalized (100) Ge seed is formed using metal induced lateral crystallization (MILC). As shown in the figure, a layer of amorphous Ge 220 has been deposited upon dielectric material 150 and the filled seed cavity 210. The layer of amorphous Ge 220 may be formed on the dielectric material 150 by any appropriate deposition process. For example, the alternating layers may be formed by alternating deposition processes including, e.g., chemical vapor deposition (C), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 3:
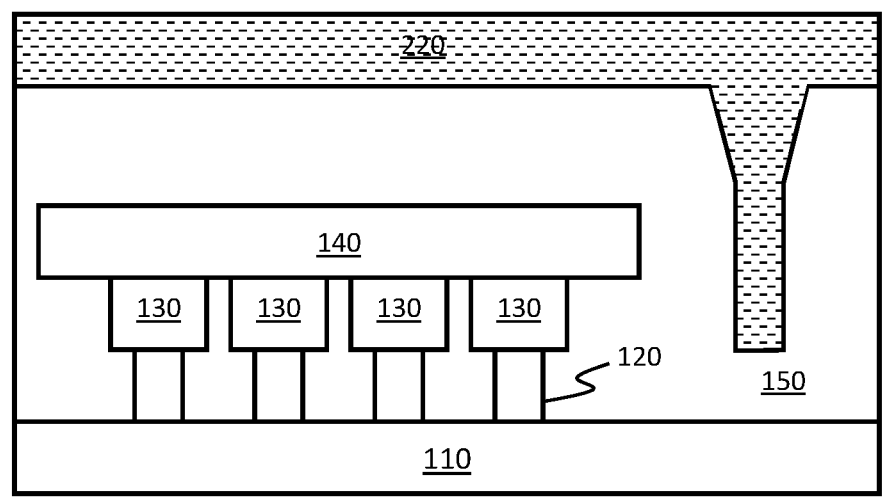
FIG. 3 provides a cross-sectional view of a step in the fabrication of a semiconductor device, according to an embodiment of the invention. The figure illustrates the device after the crystallization of the amorphous Ge by laser annealing.

Referring now to FIG. 3, the amorphous Ge layer 220 is annealed using an excimer laser and the μ-Czochralski process to grow a layer of crystalline Ge from the (100) Ge seed. During the annealing process, the amorphous Ge layer is energized and cooled. During the process the amorphous Ge crystalizes. The crystal lattice of the layer grows out from the (100) Ge seed cavity 200. After the process the Ge in the seed cavity and the Ge of the formerly amorphous Ge layer have a consistent (100) crystalline lattice.

Figure 4:
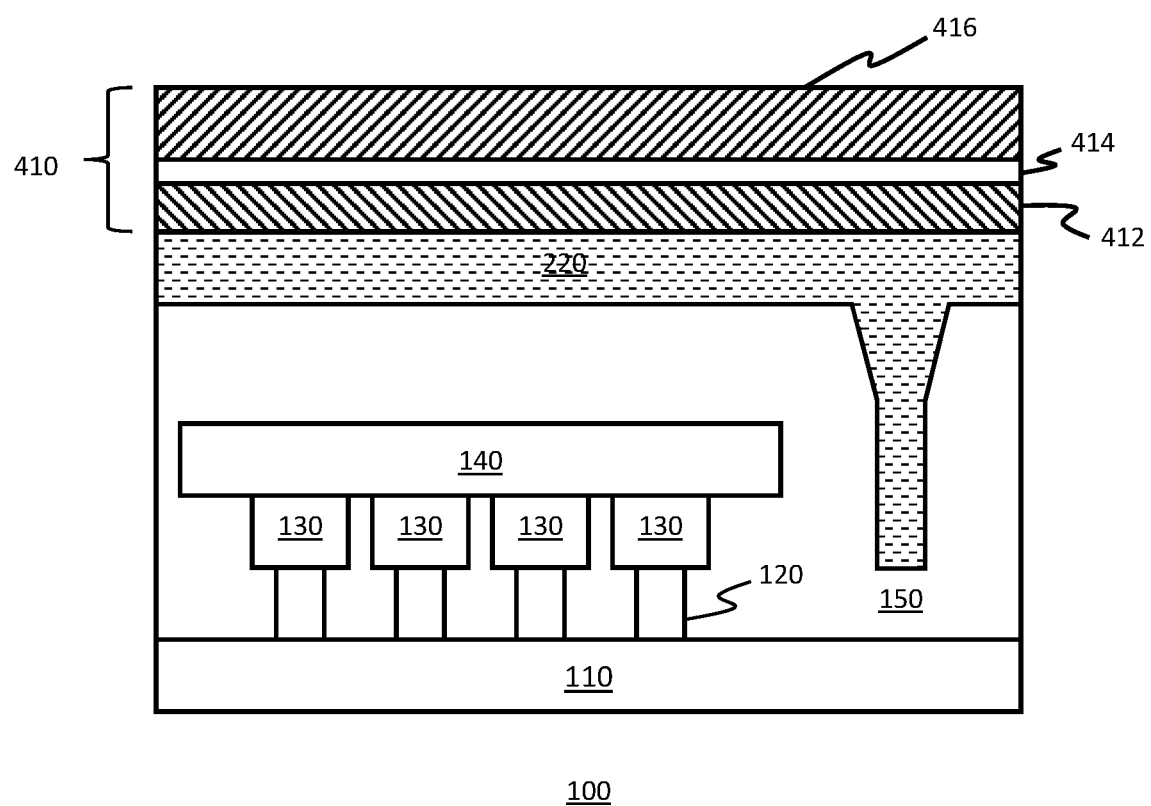
FIG. 4 provides a cross-sectional view, of a step in the fabrication of a semiconductor device, according to an embodiment of the invention. The figure illustrates the device after the addition of VCSEL layer stacks.

Referring now to FIG. 4, a VCSEL stack 410 including a plurality of GaAs based layers is epitaxially grown upon crystalline Ge layer 220. In an embodiment, the VCSEL stack 410 is between about 3 to about 6 micrometers (μm) thick. In this embodiment, the VCSEL stack 410 has a length and width such that the stack covers one or more MRAM cell structures and such that one or more VCSEL stack elements cover all MRAM cell structures in the MRAM array of the device.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In an embodiment, the VCSEL stack 410 includes a lower Bragg mirror 412 made of alternating layers of aluminum gallium arsenide (AlGaAs) and gallium arsenide (GaAs), a lower confinement layer of AlGaAs, one or more quantum well layers 414 including indium gallium arsenide (InGaAs) or indium arsenide (InAs), one or more quantum well barrier layers of GaAs, an upper confinement layer of AlGaAs, and an upper Bragg mirror 416 of alternating AlGaAs and GaAs layers. In this embodiment, the reflectivity of the upper Bragg mirror 416 is greater than the reflectivity of the lower Bragg mirror 412, resulting in an output of the finished VCSEL directed down toward the MRAM cells.

Figure 5:
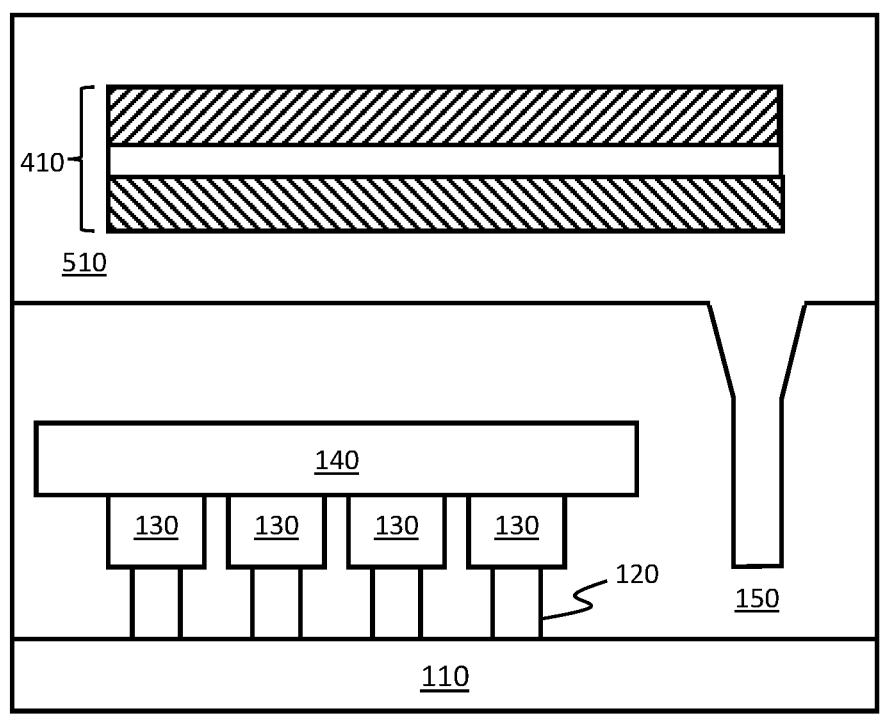
FIG. 5 provides a cross-sectional view of a step in the fabrication of a semiconductor device, according to an embodiment of the invention. The figure illustrates the device after the patterning of the VCSEL stacks, the removal of the crystalline Ge, and the deposition of a dielectric material around the VCSEL stacks.

Referring now to FIG. 5, in an embodiment, the VCSEL stack 410 and crystalline Ge layer 220 (FIG. 4) are then patterned and shaped using etching methods as described above, leaving the final shaped VCSEL stacks 410 upon the crystalline Ge 220 (FIG. 4). In an embodiment, etching yields an array of VCSEL stacks 410 disposed above the MRAM cells of the device. Etching removes material between the VCSEL stack 410 elements of the array including portions of the crystalline Ge layer disposed between the elements of the VCSEL stack 410 array. Stack anchors (not shown), such as lines of dielectric material, are disposed adjacent to the array of VCSEL stack 410 elements. The stack anchors are disposed in contact with the patterned VCSEL stacks 410 and dielectric material 150 while leaving portions of the crystalline Ge 220 beneath the VCSEL stacks 410 (FIG. 4) exposed. In an embodiment, the stack anchors are disposed using known masking and dielectric material deposition methods as described above. The crystalline Ge 220 is then removed and replaced. In an embodiment, the crystalline Ge 220 is etched away using $H_2O_2$, and replaced with a flowable dielectric material (FOX) or other suitable dielectric material 510.

Figure 6:
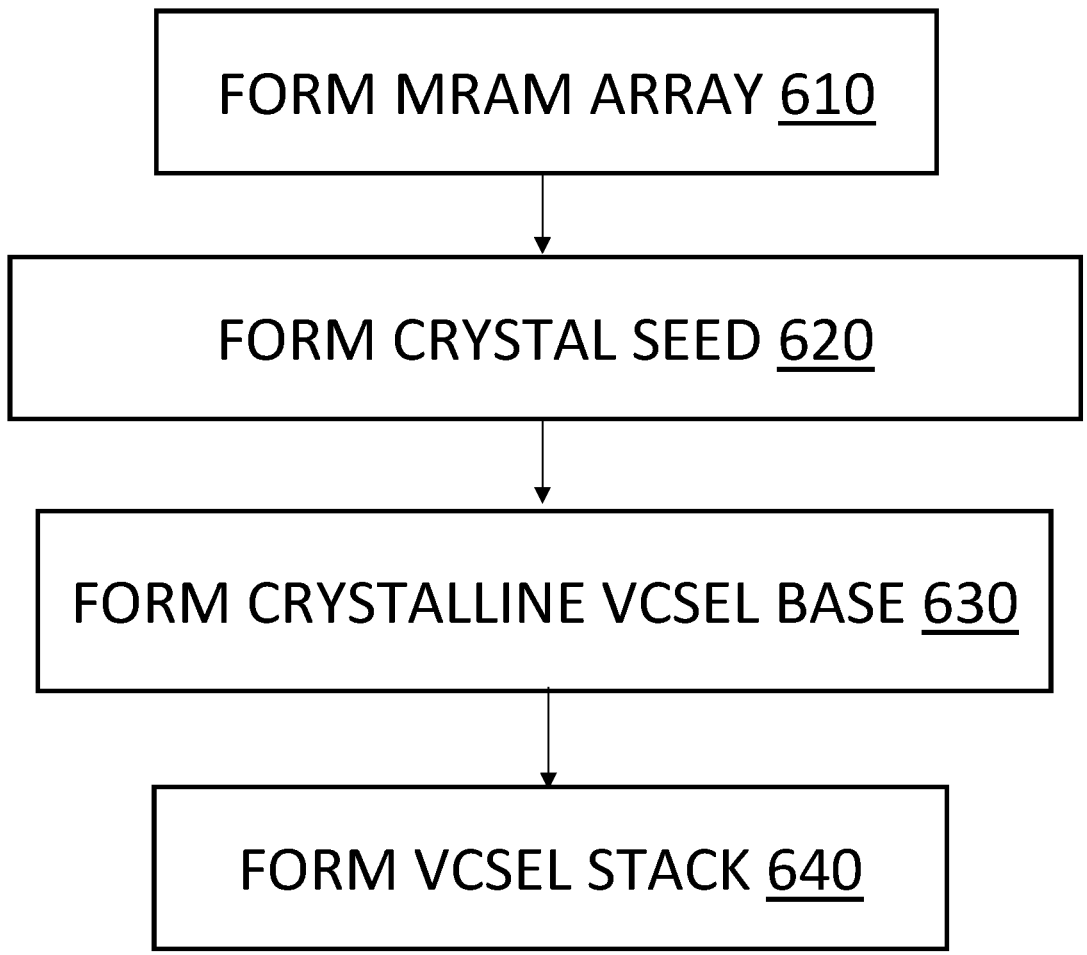
FIG. 6 provides a flowchart depicting operational steps for forming semiconductor device, according to an embodiment of the invention.

Referring now to FIG. 6, the figure provides flowchart 600 depicting operational steps for forming semiconductor devices according to an embodiment of the invention. At step 610, an array of MRAM cells is formed including appropriate bit lines and word lines. The formed MRAM array is encased in a layer of dielectric material.

At 620, a (100) oriented Ge crystal seed is formed in a cavity within the dielectric layer surrounding the MRAM array. A layer of amorphous Ge is deposited upon the dielectric layer after the seed is formed. At 630 the amorphous Ge is annealed and a Ge crystal lattice grows from the (100) Ge seed. Other orientations for the seed and grown crystalline layers are also possible.

At 640 the layers of a VCSEL are grown on the crystalline Ge layer. The layers include a bottom Bragg mirror, a quantum well, and a top Bragg mirror of the CSEL structure. Side anchors are grown adjacent to the VCSEL stack and the crystalline Ge layer is etched away from beneath the stack. The VCSEL stack is patterned and etched to the desired size and shape. A dielectric layer is deposited below and around the VCSEL elements after the patterning and etching.

The device is completed with appropriate contacts for the bit lines, word lines, and VCSEL quantum well activation points. In an embodiment, capacitors are added to enable the writing on a "1" or "0" value to all MRAM bits after an attack and defense have occurred. In an embodiment, the capacitor is sized large enough to destroy the MRAM structure in the event of a VCSEL failure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A magnetoresistive random-access memory (MRAM) structure comprising:
   an MRAM cell disposed between bit line and word line circuit elements; and
   a vertical-cavity surface-emitting laser (VCSEL) element disposed above the MRAM cell, wherein a laser output of the VCSEL is directed toward the MRAM cell, wherein the VCSEL comprises Gallium Arsenide layers.

2. The MRAM structure according to claim 1 further comprising a capacitor connected to at least one word line circuit element.

3. The MRAM structure according to claim 1, wherein the MRAM cell comprises a magnetic tunnel junction.

4. The MRAM structure according to claim 1, further comprising a capacitor sized to destructively erase MRAM contents.

5. The MRAM structure according to claim 1, wherein at least one of the bit line and word line circuit elements comprises a conductive material.

6. The MRAM structure according to claim 1, wherein the VCSEL comprises a lower Bragg mirror, an upper Bragg mirror, and a quantum well disposed between the lower and upper Bragg mirrors.

7. A magnetoresistive random-access memory (MRAM) structure comprising:
   a plurality of MRAM cells disposed between bit line and word line circuit elements;
   a vertical-cavity surface-emitting laser (VCSEL) element disposed above the plurality of MRAM cells, wherein the VCSEL comprises Gallium Arsenide layers; and
   wherein a laser output of the VCSEL is directed toward the plurality of MRAM cells.

8. The MRAM structure according to claim 7, further comprising a capacitor connected to at least one word line circuit element.

9. The MRAM structure according to claim 7, wherein the MRAM cell comprises a magnetic tunnel junction.

10. The MRAM structure according to claim 7, further comprising a capacitor sized to destructively erase MRAM contents.

11. The MRAM structure according to claim 7, wherein at least one of the bit line and word line circuit elements comprises a conductive material.

12. The MRAM structure according to claim 7, wherein the VCSEL comprises a lower Bragg mirror, an upper Bragg mirror, and a quantum well disposed between the lower and upper Bragg mirrors.

13. A method of fabricating a semiconductor device, the method comprising:
   fabricating a plurality of magnetoresistive random-access memory (MRAM) cells electrically connected to one or more bit lines and word lines, the plurality of MRAM cells encapsulated in a dielectric material;
   forming a grain filter cavity in the dielectric material;
   forming an oriented seed crystal in the grain filter;
   forming an amorphous semiconductor layer adjacent to the seed crystal;
   crystalizing the amorphous semiconductor layer;
   forming a vertical-cavity surface emitting laser (VCSEL) adjacent to the semiconductor layer;
   removing the semiconductor layer; and
   forming a dielectric layer on and around the VCSEL.

14. The method of fabricating a semiconductor device according to claim 13, further comprising forming a capacitor electrically connected to at least one of the bit line and word line.

15. The method of fabricating a semiconductor device according to claim 13, wherein the VCSEL comprises Gallium-Arsenide layers.

16. The method of fabricating a semiconductor device according to claim 13, wherein the MRAM cell comprises a magnetic tunnel junction.

17. The method of fabricating a semiconductor device according to claim 13, wherein at least one of the bit line and word line circuit elements comprises a conductive material.

18. The method of fabricating a semiconductor device according to claim 13, wherein the VCSEL comprises a lower Bragg mirror, an upper Bragg mirror, and a quantum well disposed between the lower and upper Bragg mirrors.

* * * * *